United States Patent
Qin

(10) Patent No.: US 11,327,361 B2
(45) Date of Patent: May 10, 2022

(54) DISPLAY PANEL, AND DISPLAY DEVICE AND DRIVE METHOD THEREOF

(71) Applicant: BOE TECHNOLOGY GROUP CO., LTD., Beijing (CN)

(72) Inventor: Wei Qin, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 178 days.

(21) Appl. No.: 16/330,233

(22) PCT Filed: May 11, 2018

(86) PCT No.: PCT/CN2018/086450
§ 371 (c)(1),
(2) Date: Mar. 4, 2019

(87) PCT Pub. No.: WO2018/223805
PCT Pub. Date: Dec. 13, 2018

(65) Prior Publication Data
US 2019/0227358 A1     Jul. 25, 2019

(30) Foreign Application Priority Data
Jun. 5, 2017 (CN) .......................... 201710414220.2

(51) Int. Cl.
G02F 1/13357 (2006.01)
H01L 27/32 (2006.01)
(Continued)

(52) U.S. Cl.
CPC .......... *G02F 1/1336* (2013.01); *G02F 1/1333* (2013.01); *G02F 1/1343* (2013.01);
(Continued)

(58) Field of Classification Search
CPC ................. G02F 1/1336; G02F 1/1333; G02F 1/133553; G02F 1/1343; G02F 1/133528;
(Continued)

(56) References Cited

U.S. PATENT DOCUMENTS

2008/0036953 A1   2/2008 Otake
2010/0171905 A1   7/2010 Huang et al.
(Continued)

FOREIGN PATENT DOCUMENTS

CN   103091895 A   5/2013
CN   103219336 A   7/2013
(Continued)

OTHER PUBLICATIONS

International Search Report of PCT/CN2018/086450 in Chinese, dated Aug. 16, 2018, with English translation.
(Continued)

*Primary Examiner* — James A Dudek
(74) *Attorney, Agent, or Firm* — Collar & Roe, P.C.

(57) ABSTRACT

A display panel, and a display device and a drive method thereof are provided. The display panel includes a first array substrate and a second array substrate cell-assembled with each other, and a liquid crystal layer between the first array substrate and the second array substrate. The display panel further includes a plurality of sub-pixel units, and each of the sub-pixel units includes a color film pattern on the first array substrate, an electroluminescent layer on the second array substrate, and driving electrodes for driving the liquid crystal layer and the electroluminescent layer; and the driving electrodes comprise a reflective electrode on the second array substrate and below the electroluminescent layer, a transparent electrode on the electroluminescent layer, and a pixel electrode on the first array substrate.

8 Claims, 4 Drawing Sheets

(51) Int. Cl.
*H01L 51/50* (2006.01)
*G02F 1/1335* (2006.01)
*G02F 1/1343* (2006.01)
*G02F 1/1333* (2006.01)

(52) U.S. Cl.
CPC .. *G02F 1/133528* (2013.01); *G02F 1/133553* (2013.01); *H01L 27/322* (2013.01); *H01L 27/3232* (2013.01); *H01L 27/3251* (2013.01); *H01L 51/5012* (2013.01); *G02F 1/133618* (2021.01); *G02F 2201/44* (2013.01)

(58) Field of Classification Search
CPC ........... G02F 1/133618; G02F 2201/44; G02F 1/133555; H01L 27/3251; H01L 27/322; H01L 27/3232; H01L 51/5012
See application file for complete search history.

(56) References Cited

U.S. PATENT DOCUMENTS

| | | | |
|---|---|---|---|
| 2014/0204319 A1 | 7/2014 | Cai et al. | |
| 2014/0293192 A1* | 10/2014 | Hatano | H01L 27/326 349/69 |
| 2015/0249097 A1 | 9/2015 | Qi et al. | |
| 2017/0131594 A1* | 5/2017 | Nakada | H01L 51/5206 |
| 2017/0365648 A1* | 12/2017 | Yamazaki | H01L 27/3267 |
| 2018/0039117 A1* | 2/2018 | Ikeda | G02F 1/1333 |
| 2018/0046011 A1 | 2/2018 | Tang | |
| 2019/0227358 A1 | 7/2019 | Qin | |

FOREIGN PATENT DOCUMENTS

| | | |
|---|---|---|
| CN | 103824876 A | 5/2014 |
| CN | 104123054 A | 10/2014 |
| CN | 105572986 A | 5/2016 |
| CN | 107230699 A | 10/2017 |
| TW | 201027174 A | 7/2010 |

OTHER PUBLICATIONS

Notice of Transmittal of the International Search Report of PCT/CN2018/086450 in Chinese, dated Aug. 16, 2018.
Written Opinion of the International Searching Authority of PCT/CN2018/086450 in Chinese, dated Aug. 16, 2018 with English translation.
Chinese Office Action in Chinese Application No. 201710414220.2, dated Apr. 18, 2019 with English translation.

* cited by examiner

DISPLAY PANEL, AND DISPLAY DEVICE AND DRIVE METHOD THEREOF

CROSS REFERENCE TO RELATED APPLICATIONS

This application is the National Stage of PCT/CN2018/086450 filed on May 11, 2018, which claims priority under 35 U.S.C. § 119 of Chinese Application No. 201710414220.2 filed on Jun. 5, 2017, the disclosure of which is incorporated by reference.

TECHNICAL FIELD

Embodiments of the present disclosure relate to a display panel, a display device and a method for driving a display device.

BACKGROUND

Organic light-emitting diode (OLED) display panels have the characteristics such as self-illumination, simple structure, ultra-thin, fast response, wide viewing angle, low power consumption and available for flexible display, etc., and are widely used in the display field as a result.

Embodiments of the present disclosure provide a display panel, a display device, and a method for driving a display device.

An embodiment of the present disclosure provides a display panel, comprising a first array substrate and a second array substrate assembled together to form a cell (i.e., cell-assembled) with each other, and a liquid crystal layer between the first array substrate and the second array substrate; the display panel further comprises a plurality of sub-pixel units, and each of the sub-pixel units comprises a color film pattern on the first array substrate, an electroluminescent layer on the second array substrate, and driving electrodes for driving the liquid crystal layer and the electroluminescent layer; and the driving electrodes comprise a reflective electrode on the second array substrate and below the electroluminescent layer, a transparent electrode on the electroluminescent layer, and a pixel electrode on the first array substrate.

For example, a color of the color film pattern and a color of light emitted by the electroluminescent layer located in a same sub-pixel unit with the color film pattern are same.

For example, the reflective electrode and the transparent electrode are configured to drive the electroluminescent layer; and the pixel electrode and the transparent electrode are configured to drive the liquid crystal layer.

For example, an orthographic projection of the color film pattern on the second array substrate is inside an orthographic projection of the reflective electrode on the second array substrate.

For example, an orthographic projection of the color film pattern on the second array substrate overlaps with an orthographic projection of the electroluminescent layer on the second array substrate.

For example, the orthographic projection of the electroluminescent layer on the second array substrate is inside the orthographic projection of the color film pattern on the second array substrate.

For example, the orthographic projection of the electroluminescent layer on the second array substrate coincides with the orthographic projection of the color film pattern on the second array substrate.

For example, the color film pattern and the electroluminescent layer are staggered; and an orthographic projection of the color film pattern on the second array substrate and an orthographic projection of the electroluminescent layer on the second array substrate are seamlessly spliced.

Another embodiment of the present disclosure provides a display device, comprising the display panel according to the above embodiments, and the display device further comprises a first binding region and a second binding region on the first array substrate or the second array substrate; the first binding region comprises a first signal transmission pin, and the first signal transmission pin is connected to a driving circuit on the first array substrate; the second binding region comprises a second signal transmission pin, and the second signal transmission pin is connected to a driving circuit on the second array substrate; and a driving circuit on an array substrate without a binding region is connected to a signal transmission pin via a conductive portion.

Alternatively, the display device comprises the display panel according to the above embodiments and further comprises a first binding region on the first array substrate and a second binding region on the second array substrate; the first binding region comprises a first signal transmission pin, and the first signal transmission pin is connected to a driving circuit on the first array substrate; the second binding region comprises a second signal transmission pin, and the second signal transmission pin is connected to a driving circuit on the second array substrate; and the first binding region and the second binding region are located on different sides of the display device.

Still another embodiment of the present disclosure provides a method for driving the display device according to the above embodiments, comprising: in a case where external light intensity detected is less than a first preset value, inputting a driving signal to the driving electrodes of the electroluminescent layer, and not driving the liquid crystal layer; in a case where the external light intensity detected is greater than the first preset value and less than a second preset value, inputting the driving signal to the driving electrodes of the electroluminescent layer and the liquid crystal layer; and in a case where the external light intensity detected is greater than the second preset value, inputting the driving signal to the driving electrodes of the liquid crystal layer, and not driving the electroluminescent layer.

In the display panel, the display device and the method for driving the display device provided by at least one embodiment of the present disclosure, the sub-pixel unit of the display panel comprises two parts, that is, when the display is performed, only the first array substrate drives the liquid crystal layer to complete display, or only the second array substrate drives the electroluminescent layer to complete display, and of course, the two array substrates can simultaneously drive to complete display. The reflective electrode is further disposed on a side of the electroluminescent layer away from the liquid crystal layer, and the ambient light can be reflected onto the first array substrate as a backlight of the first array substrate to utilize the ambient light. In this way, when the ambient light is relatively dim, the second array substrate drives the electroluminescent layer to implement display. Because when the ambient light is dim, there are not many available light sources and the display panel does not need to be very bright, at this time, the first array substrate may not be driven. When the ambient light is brighter, the brightness of the display panel needs to be increased. At this time, in order to ensure the display effect, the current of the second array substrate needs to be slightly increased to increase the brightness of the display panel. Because the backlight used in the case where the first array substrate drives the liquid crystal layer to implement display is the ambient light, when the ambient light is very bright, the brightness of the display panel is closer to the brightness of the ambient light when the first array substrate drives the liquid crystal layer to complete display, and the brightness in the case where the second array substrate drives the electroluminescent layer to complete display is flooded in the ambient light. At this time, the driving of the second array substrate is stopped, only the first array substrate drives the liquid crystal layer to complete display, and the display effect is not affected. Only when the ambient light is brighter, the current of the second array substrate is slightly increased to ensure the display effect, and when the ambient light is very bright, the driving of the second array substrate is stopped. Regardless of the brightness of the ambient light, the display effect of the display panel can be guaranteed. Compared with display panels in the prior art, the problem of accelerating the aging of the OLED display panel, due to the need to increase the current of the OLED display panel (the second array substrate) in a high-brightness scene, is alleviated.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

Figure 1:
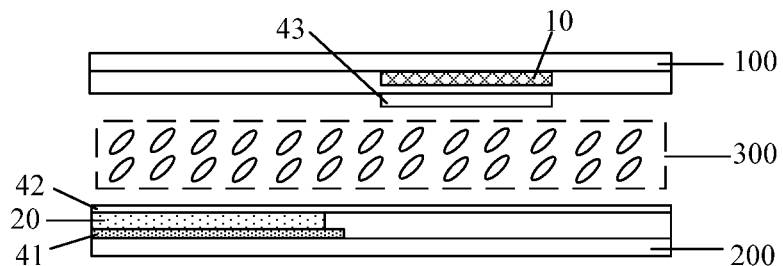
FIG. 1 is a first schematic structural diagram of a display panel provided by an embodiment of the present disclosure.

Reference signs: 01—first binding region; 02—second binding region; 100—first array substrate; 200—second array substrate; 300—liquid crystal layer; 10—color film pattern; 20—electroluminescent layer; 41—reflective electrode; 42—transparent electrode; 43—pixel electrode; 50—polarizer; 60—conductive portion; and 70—encapsulation structure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For known OLED display panels, when used in a situation where the ambient light is dim, OLED display panels have a preferable display effect, and the main performances are: bright colors, black image with a more black color, and the like. However, when used outdoors or in a situation where the ambient light is bright, OLED display panels have intense reflected light, which is mainly because that anode metal electrode in the OLED display panels has an intense reflection effect. Therefore, when the user uses them in an outdoor environment, there may be cases where the display effect is affected because of invisibility and contrast reduction.

In this way, when OLED display panels are used in a high-brightness environment, the user has to increase screen brightness in order to see the image clearly. However, after the screen brightness is increased, the current of OLED display panels is caused to be increased, thereby accelerating the aging of OLED display panels, and affecting the service life of the display panels.

An embodiment of the present disclosure provides a display panel, as illustrated in FIG. 1, which comprises a first array substrate 100 and a second array substrate 200 cell-assembled with each other, and a liquid crystal layer 300 between the first array substrate 100 and the second array substrate 200. The display panel comprises a plurality of sub-pixel units (only one sub-pixel unit is illustrated in FIG. 1 as an example), and each of the sub-pixel units comprises a color film pattern 10 on the first array substrate 100, an electroluminescent layer 20 on the second array substrate 200, and driving electrodes for driving the liquid crystal layer 300 and the electroluminescent layer 20. The driving electrodes comprise a reflective electrode 41 on the second array substrate 200 and below the electroluminescent layer 20, a transparent electrode 42 on the electroluminescent layer 20, and a pixel electrode 43 on the first array substrate 100.

First, it should be noted that those skilled in the art should understand that the first array substrate 100 and the second array substrate 200 should be respectively provided with driving circuits for driving the liquid crystal layer 300 and the electroluminescent layer 20.

For thin film transistors on the first array substrate 100 and the second array substrate 200, the thin film transistors may be amorphous silicon thin film transistors, polysilicon thin film transistors, metal oxide thin film transistors, organic thin film transistors, etc., according to the different of the materials of semiconductor active layers. Based on this, the thin film transistors may also be in staggered type, inverted staggered type, coplanar type, anti-coplanar type, and the like.

Second, each sub-pixel unit of the display panel comprises the color film pattern 10, the electroluminescent layer 20, and the driving electrodes for driving the liquid crystal layer 300 and the electroluminescent layer 20, that is, the display panel comprises both liquid crystal display and organic electroluminescent diode display.

The driving electrodes comprise the reflective electrode 41 and the transparent electrode 42 on the second array substrate 200. The reflective electrode 41 is located on a side of the electroluminescent layer 20 away from the liquid crystal layer 300, and the transparent electrode 42 is located on a side of the electroluminescent layer 20 adjacent to the liquid crystal layer 300. The driving electrodes further comprise the pixel electrode 43 on the first array substrate 100. The pixel electrode 43 may be disposed on a side of the color film pattern 10 away from the liquid crystal layer 300, or may be disposed on a side of the color film pattern 10 adjacent to the liquid crystal layer 300.

Figure 2:
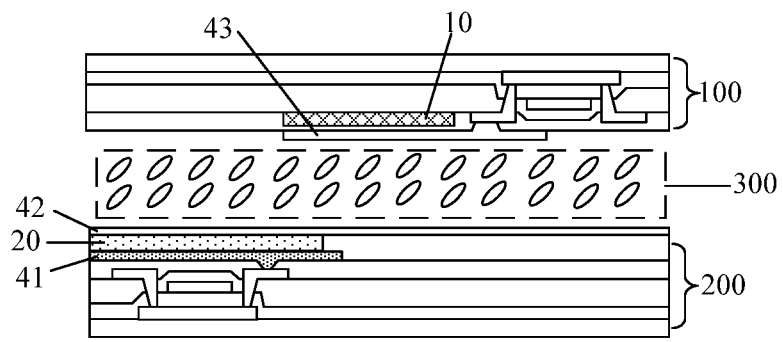
FIG. 2 is a second schematic structural diagram of a display panel provided by an embodiment of the present disclosure.

In addition, when the driving electrodes comprise only the reflective electrode 41, the transparent electrode 42, and the pixel electrode 43, the reflective electrode 41, the transparent electrode 42, and the driving circuit on the second array substrate 200 drive the electroluminescent layer 20 to complete OLED display; and the transparent electrode 42, the pixel electrode 43, and the driving circuit on the first array substrate 100 drive the liquid crystal layer 300 to complete liquid crystal display. Of course, the driving electrodes may further comprise a common electrode, and the common electrode may be disposed on the first array substrate 100 or on the second array substrate 200. At this time, the common electrode, the pixel electrode 43 and the driving circuit on the first array substrate 100 drive the liquid crystal layer 300 to complete liquid crystal display. Or other ways to complete OLED display and liquid crystal display may be accepted. As illustrated in FIG. 2, the pixel electrode 43 is electrically connected to a drain electrode of the thin film transistor on the first array substrate 100, and the reflective electrode 41 is electrically connected to the drain electrode of the thin film transistor on the second array substrate 200.

Furthermore, a reflective surface of the reflective electrode 41 should face a side where the first array substrate 100 is located, that is, the ambient light is incident from a side of the first array substrate 100 away from the second array substrate 200, and is reflected by the reflective surface of the reflective electrode 41 and toward to the first array substrate 100 again. Here, the material of the reflective electrode 41 is not limited.

Thirdly, the OLED display and the liquid crystal display in the sub-pixel units may be separately performed, or may be combined and performed together, and an area where the color film pattern 10 and the electroluminescent layer 20 are located constitutes a display area of the sub-pixel units.

The arrangement of the sub-pixel units in the display panel is not limited, and may be, for example, an array arrangement or other known arrangement.

Fourthly, the color film patterns 10 in adjacent three sub-pixels are a unit, and each unit comprises a three-primary-color pattern, and the first primary color, the second primary color, and the third primary color may be red, blue, and green. For example, the first primary color is red, the second primary color is yellow, and the third primary color is red. Of course, other combinations are also possible. Alternatively, the first primary color, the second primary color, and the third primary color may also be cyan, magenta, and yellow, and for example, the first primary color is cyan, the second primary color is magenta, and the third primary color is yellow, and of course other combinations may be possible. Certainly, the color film patterns 10 in four sub-pixels may also be a unit, and each unit comprises a three-primary-color pattern and a white pattern.

Those skilled in the art should understand that a black matrix should be disposed between adjacent color film patterns 10 in order to avoid light mixing between adjacent sub-pixels.

In the display panel provided by at least one embodiment of the present disclosure, the sub-pixel unit of the display panel comprises two parts, that is, when the display is performed, only the first array substrate 100 drives the liquid crystal layer 300 to complete display, or only the second array substrate 200 drives the electroluminescent layer 20 to complete display, and of course, the two array substrates can simultaneously drive to complete display. The reflective electrode 41 is further disposed on the side of the electroluminescent layer 20 away from the liquid crystal layer 300, and the ambient light can be reflected onto the first array substrate 100 as a backlight of the first array substrate 100 to utilize the ambient light. In this way, when the ambient light is relatively dim, the second array substrate 200 drives the electroluminescent layer 20 to implement display. Because when the ambient light is dim, there are not many available light sources and the display panel does not need to be very bright, at this time, the first array substrate 100 may not be driven. When the ambient light is brighter, the brightness of the display panel needs to be increased. At this time, in order to ensure the display effect, the current of the second array substrate 200 needs to be slightly increased to increase the brightness of the display panel. Because the backlight used in the case where the first array substrate 100 drives the liquid crystal layer 300 to complete display is the ambient light, when the ambient light is very bright, the brightness of the display panel is closer to the brightness of the ambient light when the first array substrate 100 drives the liquid crystal layer 300 to complete display, and the brightness in the case where the second array substrate 200 drives the electroluminescent layer 20 to complete display is flooded in the ambient light. At this time, the driving of the second array substrate 200 is stopped, only the first array substrate 100 drives the liquid crystal layer 300 to complete display, and the display effect is not affected. Only when the ambient light is brighter, the current of the second array substrate 200 is slightly increased to ensure the display effect, and when the ambient light is very bright, the driving of the second array substrate 200 is stopped. Regardless of the brightness of the ambient light, the display effect of the display panel can be guaranteed. Compared with display panels in the prior art, the problem of accelerating the aging of the OLED display panel due to the need to increase the current of the OLED display panel (the second array substrate 200) in a high-brightness scene is alleviated.

For example, a color of the color film pattern 10 and a color of light emitted by the electroluminescent layer 20 located in a same sub-pixel unit with the color film pattern 10 are same.

For example, the color film pattern 10 in the sub-pixel unit is red, and the color of the light emitted by the electroluminescent layer 20 is also red.

Another embodiment of the present disclosure provides a method for manufacturing a display panel, which can manufacture the display panel as illustrated in FIG. 2. For the manufacturing of the second array substrate 200, it may be performed on a second glass substrate by conventional low temperature polysilicon (LTPS) technology to implement a thin film transistor layer. In the process, a layer of amorphous silicon is first formed, and next laser scanning is performed to convert the amorphous silicon into polysilicon at a short high temperature, and then a mask process is performed to pattern the polysilicon layer. Next, a gate insulating layer is formed, and the gate insulating layer is generally made of a silicon oxide material. Then a gate metal layer is formed on the gate insulating layer, and the gate metal layer is patterned by a mask process and an etching process. Next, a spacer layer which is configured to insulate is formed, and via holes of source and drain metal are formed on the spacer layer by a mask process and an etching process. Then, film formation and patterning of the source and drain metal layer are performed. Next, a flat layer is performed thereon, an anode via hole is formed, and an anode (the reflective electrode 41) is connected to the source electrode of the thin film transistor through the via hole, thereby implementing the driving of the anode of the OLED. Next, in a manufacturing phase of EL (the electroluminescent layer 20), the location of the luminescent material is implemented by forming a thicker resin layer on the anode and performing a mask process. Then, directional vapor deposition of the electroluminescent layer 20 is performed, and the electroluminescent layer 20 is formed in the notch of the resin layer and in contact with the anode. Next, film formation of a cathode (the transparent electrode 42) is performed, thereby completing the manufacturing of the second array substrate 200.

In the manufacturing of the first array substrate 100, a polysilicon layer, a gate insulating layer, a gate metal layer, an insulating spacer layer, and a source and drain metal layer are respectively formed on a first glass substrate to form the thin film transistor on the first glass substrate. Next, the color film pattern 10 is formed, and then the pixel electrode 43 is formed, thereby completing the manufacturing of the first array substrate 100.

Then, the process of cell assembling is performed by dropping the liquid crystal on the completed second array substrate 200, and then accurately assembling the first array substrate 100 on the second array substrate 200. As illustrated in FIG. 2, the liquid crystal layer 300 is between the first array substrate 100 and the second array substrate 200.

In the embodiments of the present disclosure, the color of the color film pattern 10 and the color of the light emitted by the electroluminescent layer 20 in the same sub-pixel unit with the color film pattern 10 are the same. When the ambient light is relatively bright, the brightness of the display panel needs to be increased. At this time, on the basis of the driving of the second array substrate 200, the first array substrate 100 is also driven to increase the brightness of the display panel by using the ambient light, without increasing the brightness of the display panel by increasing the current of the second array substrate 200. The problem of accelerating the aging of the OLED display panel due to the need to increase the current of the OLED display panel in a high-brightness scene can be further alleviated.

For example, as illustrated in FIG. 2, the reflective electrode 41 and the transparent electrode 42 are configured to drive the electroluminescent layer 20; and the pixel electrode 43 and the transparent electrode 42 are configured to drive the liquid crystal layer 300.

The material of the reflective electrode 41 may be selected from the structure of ITO/Ag/ITO, which has a better reflective property. ITO is indium tin oxide; and Ag is silver. That is, the reflective electrode 41 comprises three layers, both the upper and lower layers are ITO, and the middle layer is a layer of Ag.

That is, in the embodiments of the present disclosure, the driving electrodes comprise only the reflective electrode 41, the transparent electrode 42, and the pixel electrode 43. The working principle of the display panel is bellow. The OLED display is that the driving circuit on the second array substrate 200 controls the electroluminescent layer 20, the reflective electrode 41 and the transparent electrode 42 respectively serve as the anode and the cathode of the OLED display unit, the OLED is a top-emitting structure, data signal controls the voltage of the anode (the reflective electrode 41) of the OLED display unit through the thin film transistor on the second array substrate 200, and a constant voltage is input to the cathode (the transparent electrode 42) of the OLED display unit, to drive the electroluminescent layer 20 to emit light. The liquid crystal display is that the driving circuit on the first array substrate 100 controls the deflection of the liquid crystal layer 300, the voltage of the pixel electrode 43 is controlled by the thin film transistor on the first array substrate 100, and the cathode of the OLED display unit has a constant voltage, thereby controlling the deflection of the liquid crystal layer 300 by the voltage between the constant voltage of the cathode and the pixel electrode 43. The anode of the OLED display unit is highly reflective, thereby implementing a good reflection effect.

Figure 3:
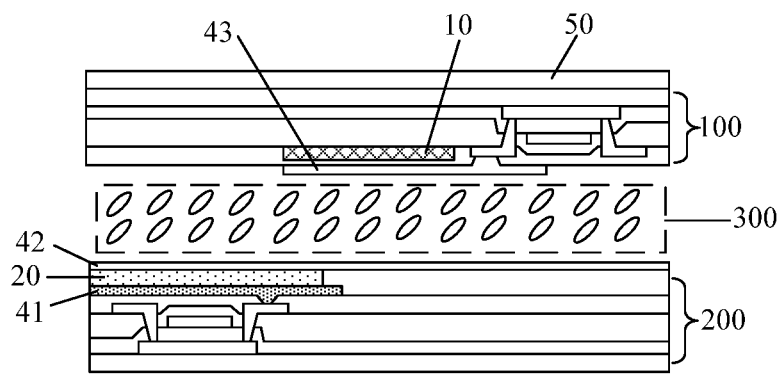
FIG. 3 is a third schematic structural diagram of a display panel provided by an embodiment of the present disclosure.

Here, when the liquid crystal layer 300 is blue phase liquid crystal, the display panel may not need to be provided with a polarizer. When the liquid crystal layer 300 is normal liquid crystal, as illustrated in FIG. 3, a polarizer 50 is further disposed on the side of the first array substrate 100 away from the second array substrate 200 to implement polarization control of the reflective liquid crystal.

In the embodiments of the present disclosure, the transparent electrode 42 on the second array substrate 200 serves as both the driving electrode of the electroluminescent layer 20 and the driving electrode of the liquid crystal layer 300, so that the transparent electrode 42 is shared, which saves cost and enables the display panel to be light and thin.

Figure 4:
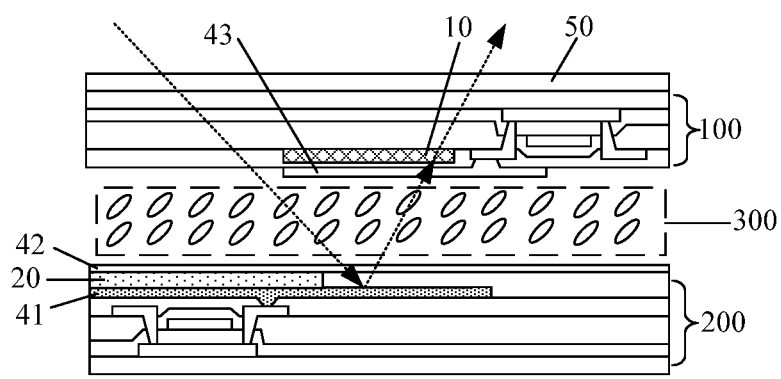
FIG. 4 is a fourth schematic structural diagram of a display panel provided by an embodiment of the present disclosure.

For example, as illustrated in FIG. 4, an orthographic projection of the color film pattern 10 on the second array substrate 200 is inside an orthographic projection of the reflective electrode 41 on the second array substrate 200.

That is, the reflective electrode 41 is disposed at the position where the color film pattern 10 is disposed.

In the embodiments of the present disclosure, the orthographic projection of the color film pattern 10 on the second array substrate 200 is inside the orthographic projection of the reflective electrode 41 on the second array substrate 200, so that the reflective electrode 41 is disposed at the position where the color film pattern 10 is disposed, and more ambient light can be reflected onto the first array substrate 100 by the reflective electrode 41, thereby improving the utilization rate of the ambient light.

For example, as illustrated in FIG. 4, the orthographic projection of the color film pattern 10 on the second array substrate 200 overlaps with an orthographic projection of the electroluminescent layer 20 on the second array substrate 200.

The size of the overlapping portion is not limited, and it is only needed that the color film pattern 10 and the electroluminescent layer 20 have an overlapped portion.

In the embodiments of the present disclosure, the orthographic projection of the color film pattern 10 on the second array substrate 200 overlaps with the orthographic projection of the electroluminescent layer 20 on the second array substrate 200, which can prevent the sub-pixel unit from being unfiltered, and ensure the display effect of the display panel.

Figure 5:
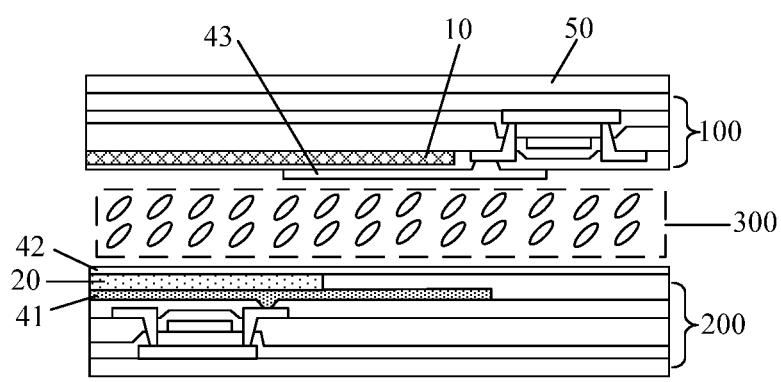
FIG. 5 is a fifth schematic structural diagram of a display panel provided by an embodiment of the present disclosure.

For example, as illustrated in FIG. 5, the orthographic projection of the electroluminescent layer 20 on the second array substrate 200 is inside the orthographic projection of the color film pattern 10 on the second array substrate 200.

That is, the entire display area in the sub-pixel unit is provided with the color film pattern 10, and only partial area of the display area of the sub-pixel unit is provided with the electroluminescent layer 20.

In the embodiments of the present disclosure, the orthographic projection of the electroluminescent layer 20 on the second array substrate 200 is inside the orthographic projection of the color film pattern 10 on the second array substrate 200, which can prevent the ambient light reflected and injected into the human eye from being white light, thereby improving the display effect.

Figure 6:
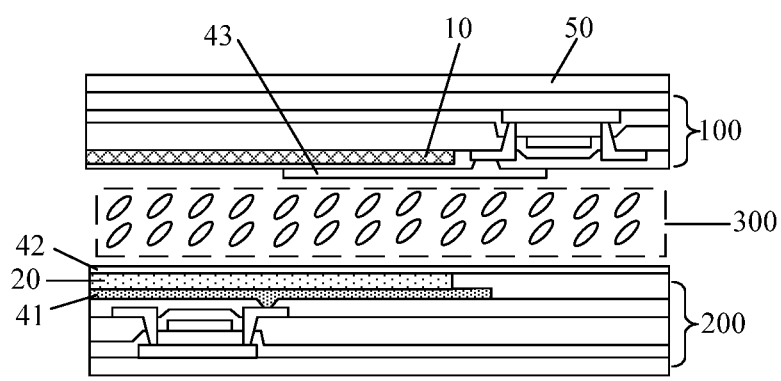
FIG. 6 is a sixth schematic structural diagram of a display panel provided by an embodiment of the present disclosure.

For example, as illustrated in FIG. 6, the orthographic projection of the electroluminescent layer 20 on the second array substrate 200 coincides with the orthographic projection of the color film pattern 10 on the second array substrate 200.

That is, the electroluminescent layer 20 is disposed where the color film pattern 10 is disposed.

In the embodiments of the present disclosure, the orthographic projection of the electroluminescent layer 20 on the second array substrate 200 coincides with the orthographic projection of the color film pattern 10 on the second array substrate 200, so that the brightness and the image quality of the image displayed at each position of the sub-pixel unit are relatively uniform, and it can be avoid that some areas where the light are filtered are darker than the unfiltered area, thereby improving the display effect.

Figure 7:
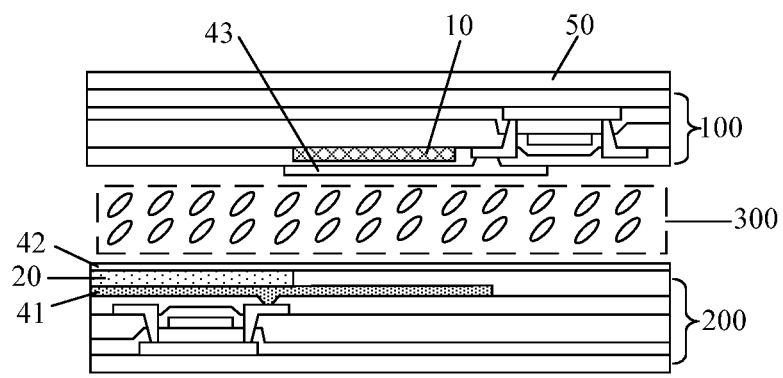
FIG. 7 is a seventh schematic structural diagram of a display panel provided by an embodiment of the present disclosure.

For example, as illustrated in FIG. 7, the color film pattern 10 and the electroluminescent layer 20 are staggered; and the orthographic projection of the color film pattern 10 on the second array substrate 200 and the orthographic projection of the electroluminescent layer 20 on the second array substrate 200 are seamlessly spliced.

That is, the orthographic projection of the color film pattern 10 on the second array substrate 200 and the orthographic projection of the electroluminescent layer 20 on the second array substrate 200 do not overlap with each other, and the edge of the color film pattern 10 close to the electroluminescent layer 20 coincides with the edge of the electroluminescent layer 20 close to the color film pattern 10.

In the embodiments of the present disclosure, by not setting the color film pattern 10 at the corresponding position of the electroluminescent layer 20, the color film pattern 10 can be prevented from filtering the light emitted by the electroluminescent layer 20, thereby reducing energy consumption.

Figure 8:
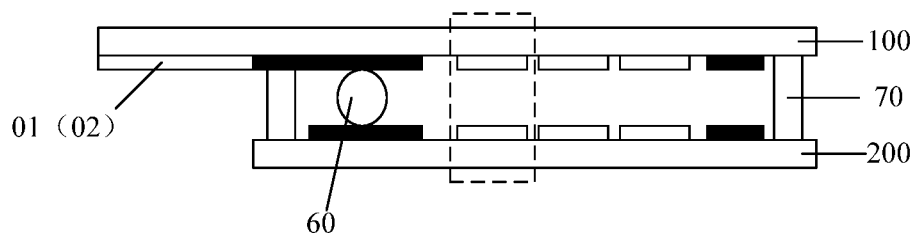
FIG. 8 is a first schematic structural diagram of a display device provided by an embodiment of the present disclosure.
Figure 9:
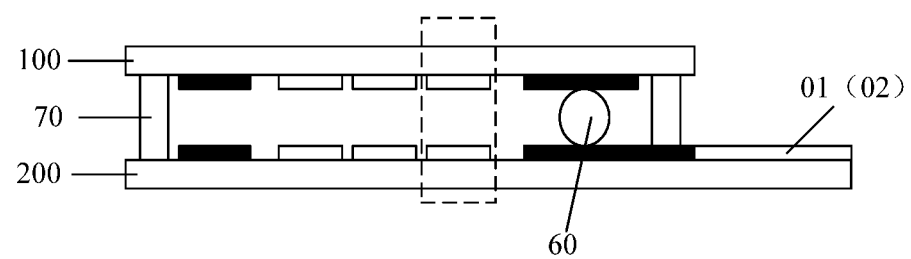
FIG. 9 is a second schematic structural diagram of a display device provided by an embodiment of the present disclosure.

An embodiment of the present disclosure further provides a display device. As illustrated in FIG. 8 and FIG. 9, the display device comprises the display panel described in the above embodiments. The display device further comprises a first binding region 01 and a second binding region 02 on the first array substrate 100 or the second array substrate 200; the first binding region 01 comprises a first signal transmission pin (not illustrated in the figure), and the first signal transmission pin is connected to a driving circuit on the first array substrate 100 (not illustrated in the figure); the second binding region 02 comprises a second signal transmission pin (not illustrated in the figure), and the second signal transmission pin is connected to a driving circuit on the second array substrate 200 (not illustrated in the figure); and a driving circuit on an array substrate without a binding region is connected to a signal transmission pin via a conductive portion 60.

That is, as illustrated in FIG. 8, the display device further comprises the first binding region 01 and the second binding region 02 on the first array substrate 100; the first binding region 01 comprises the first signal transmission pin (not illustrated in the figure), and the first signal transmission pin is connected to the driving circuit on the first array substrate 100 (not illustrated in the figure); and the second binding region 02 comprises the second signal transmission pin (not illustrated in the figure), and the second signal transmission pin is connected to the driving circuit on the second array substrate 200 via the conductive portion 60 (not illustrated in the figure).

Alternatively, as illustrated in FIG. 9, the display device further comprises the first binding region 01 and the second binding region 02 on the second array substrate 200; the first binding region 01 comprises the first signal transmission pin (not illustrated in the figure), and the first signal transmission pin is connected to the driving circuit on the first array substrate 100 via the conductive portion 60 (not illustrated in the figure); and the second binding region 02 comprises the second signal transmission pin (not illustrated in the figure), and the second signal transmission pin is connected to the driving circuit on the second array substrate 200 (not illustrated in the figure).

As illustrated in FIG. 8 and FIG. 9, the display device further comprises an encapsulation structure 70 for encapsulating the first array substrate 100 and the second array substrate 200. A material of the encapsulation structure 70 may be, for example, glass.

In FIG. 8 and FIG. 9, a square frame of dotted line represents a sub-pixel unit. The edge of the display device is a non-display area, the non-display area is provided with the driving circuit, and the driving circuit on the array substrate without the binding region is connected to the signal transmission pin in the binding region after being led to the array substrate provided with the binding region by the conductive portion 60. The driving circuit comprises a gate driving circuit and a source driving circuit, and the gate driving circuit and/or the source driving circuit can be led to the array substrate provided with the bonding region by the conductive portion 60. The gate driving circuit can implement progressive scan function by implementing progressive pulse adopting the principle of shift registration.

Here, the conductive portion 60 may be, for example, a conductive ball.

In addition, those skilled in the art should understand that the first binding region 01 and the second binding region 02 should not affect each other.

In the embodiments of the present disclosure, by setting the first binding region 01 and the second binding region 02 on the same array substrate, the structure of the display device can be simplified, the process of repeatedly preparing the binding region can be avoided, and the production efficiency can be improved.

Figure 10:
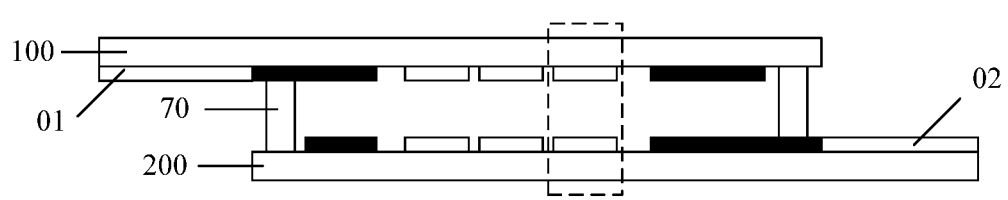
FIG. 10 is a third schematic structural diagram of a display device provided by an embodiment of the present disclosure.

Alternatively, as illustrated in FIG. 10, the display device comprises the display panel described in the above embodiments. The display device further comprises a first binding region 01 on the first array substrate 100 and a second binding region 02 on the second array substrate 200; the first binding region 01 comprises a first signal transmission pin (not illustrated in the figure), and the first signal transmission pin is connected to a driving circuit on the first array substrate 100 (not illustrated in the figure); the second binding region 02 comprises a second signal transmission pin (not illustrated in the figure), and the second signal transmission pin is connected to a driving circuit on the second array substrate 200 (not illustrated in the figure); and the first binding region 01 and the second binding region 02 are located on different sides of the display device.

That is, the first array substrate 100 and the second array substrate 200 are driven separately. The lead-out of the binding region is implemented by the misalignment between the first array substrate 100 and the second array substrate 200, thereby implementing that both the first array substrate 100 and the second array substrate 200 can be controlled through the connection to an external circuit to achieve display driving.

In the embodiments of the present disclosure, by respectively setting the first binding region 01 and the second binding region 02 on the first array substrate 100 and the second array substrate 200, the process of connecting the driving circuit on the array substrate without the binding region to the array substrate provided with the binding region can be simplified, and the difficulty of the process is reduced.

Figure 11:
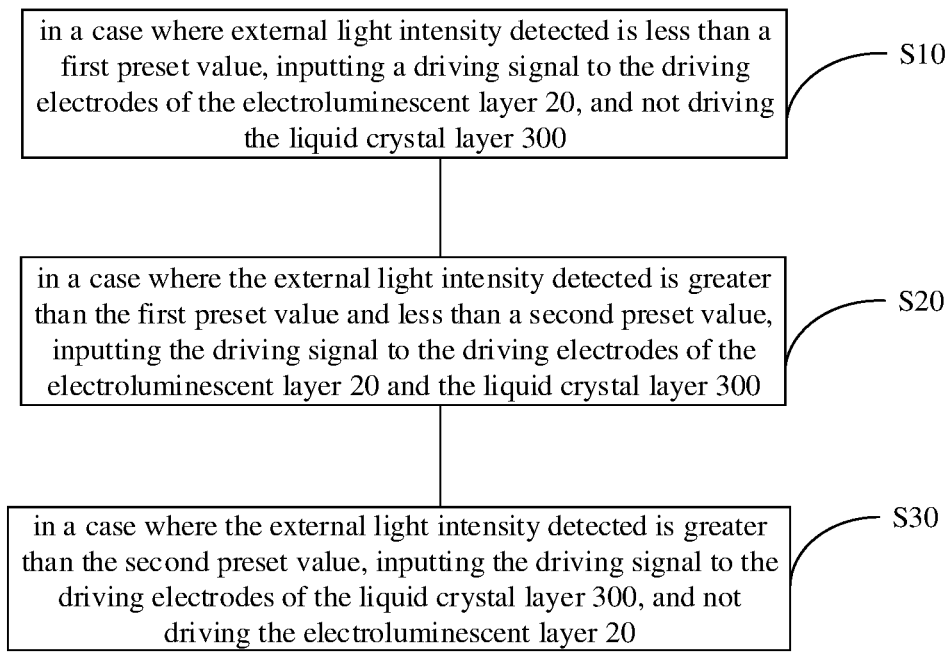
FIG. 11 is a flow chart of a method for driving a display device provided by an embodiment of the present disclosure.

An embodiment of the present disclosure further provides a method for driving the display device described above, as illustrated in FIG. 11, which comprises:

Step S10: in a case where external light intensity detected is less than a first preset value, inputting a driving signal to the driving electrodes of the electroluminescent layer 20, and not driving the liquid crystal layer 300;

Step S20: in a case where the external light intensity detected is greater than the first preset value and less than a second preset value, inputting the driving signal to the driving electrodes of the electroluminescent layer 20 and the liquid crystal layer 300; and Step S30: in a case where the external light intensity detected is greater than the second preset value, inputting the driving signal to the driving electrodes of the liquid crystal layer 300, and not driving the electroluminescent layer 20.

First, it should be noted that the first preset value and the second preset value may be set according to the use environment.

Second, in a case where the external light intensity detected is equal to the first preset value, the step S10 may be performed, or the step S20 may be performed. In a case where the external light intensity detected is equal to the second preset value, the step S20 may be performed, or the step S30 may be performed.

Thirdly, the ambient light detection can be accomplished, for example, by an ambient light sensor disposed within the display device.

The beneficial effects of the method for driving the display device provided by the embodiments of the present disclosure are the same as the beneficial effects of the display device, which are not described herein again.

What have been described above are only specific implementations of the present disclosure, the protection scope of the present disclosure is not limited thereto, and the protection scope of the present disclosure should be based on the protection scope of the claims.

What is claimed is:

1. A display panel, comprising a first array substrate and a second array substrate cell-assembled with each other, and a liquid crystal layer between the first array substrate and the second array substrate,
    wherein the display panel further comprises a plurality of sub-pixel units, and each of the sub-pixel units comprises a color film pattern on the first array substrate, an electroluminescent layer on the second array substrate, and driving electrodes for driving the liquid crystal layer and the electroluminescent layer; and the driving electrodes comprise a reflective electrode on the second array substrate and below the electroluminescent layer, a transparent electrode on the electroluminescent layer, and a pixel electrode on the first array substrate;
    wherein the reflective electrode and the transparent electrode are configured to drive the electroluminescent layer; and the pixel electrode and the transparent electrode are configured to drive the liquid crystal layer;
    the reflective electrode is further configured to reflect ambient light onto the first array substrate as a backlight of the first array substrate driving the liquid crystal layer for display;
    the color film pattern and the electroluminescent layer are staggered and do not overlap; and
    an orthographic projection of the color film pattern on the second array substrate and an orthographic projection of the electroluminescent layer on the second array substrate are seamlessly spliced.

2. The display panel according to claim 1, wherein a color of the color film pattern and a color of light emitted by the electroluminescent layer located in a same sub-pixel unit with the color film pattern are same.

3. A display device, comprising the display panel according to claim 1.

4. A method for driving the display device according to claim 3, comprising:
    in a case where external light intensity detected is less than a first preset value, inputting a driving signal to the driving electrodes of the electroluminescent layer, and not driving the liquid crystal layer;
    in a case where the external light intensity detected is greater than the first preset value and less than a second preset value, inputting the driving signal to the driving electrodes of the electroluminescent layer and the liquid crystal layer; and
    in a case where the external light intensity detected is greater than the second preset value, inputting the driving signal to the driving electrodes of the liquid crystal layer, and not driving the electroluminescent layer.

5. The display device according to claim 3, further comprising a first binding region and a second binding region on the first array substrate or the second array substrate;
    wherein the first binding region comprises a first signal transmission pin, and the first signal transmission pin is connected to a first driving circuit on the first array substrate; the second binding region comprises a second signal transmission pin, and the second signal transmission pin is connected to a second driving circuit on the second array substrate; and the first driving circuit on the first array substrate without the first binding region and the second binding region is connected to the first signal transmission pin via a conductive portion, or the second driving circuit on the second array substrate without the first binding region and the second binding region is connected to the second signal transmission pin via a conductive portion.

6. The display device according to claim 3, further comprising a first binding region on the first array substrate and a second binding region on the second array substrate;
wherein the first binding region comprises a first signal transmission pin, and the first signal transmission pin is connected to a driving circuit on the first array substrate; the second binding region comprises a second signal transmission pin, and the second signal transmission pin is connected to a driving circuit on the second array substrate; and the first binding region and the second binding region are located on different sides of the display device.

7. The display panel according to claim 1, wherein the pixel electrode is on a side of the color film pattern away from the liquid crystal layer, or on a side of the color film pattern adjacent to the liquid crystal layer.

8. The display panel according to claim 1, wherein a reflective surface of the reflective electrode face a side where the first array substrate is located.

* * * * *